United States Patent
Chen et al.

(10) Patent No.: US 10,483,386 B2
(45) Date of Patent: Nov. 19, 2019

(54) SEMICONDUCTOR DEVICE, TRANSISTOR HAVING DOPED SEED LAYER AND METHOD OF MANUFACTURING THE SAME

(71) Applicant: TAIWAN SEMICONDUCTOR MANUFACTURING COMPANY, LTD., Hsinchu (TW)

(72) Inventors: Chi-Ming Chen, Zhubei (TW); Po-Chun Liu, Hsinchu (TW); Chung-Yi Yu, Hsinchu (TW); Chia-Shiung Tsai, Hsinchu (TW); Ru-Liang Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/158,157

(22) Filed: Jan. 17, 2014

(65) Prior Publication Data

US 2015/0206962 A1    Jul. 23, 2015

(51) Int. Cl.
| | |
|---|---|
| *H01L 29/778* | (2006.01) |
| *H01L 29/20* | (2006.01) |
| *H01L 29/66* | (2006.01) |
| *H01L 21/02* | (2006.01) |
| *H01L 21/265* | (2006.01) |

(52) U.S. Cl.
CPC ...... *H01L 29/7787* (2013.01); *H01L 21/0251* (2013.01); *H01L 21/0254* (2013.01); *H01L 21/0262* (2013.01); *H01L 21/02458* (2013.01); *H01L 21/02579* (2013.01); *H01L 29/2003* (2013.01); *H01L 29/66462* (2013.01); *H01L 21/26546* (2013.01)

(58) Field of Classification Search
CPC ................ H01L 29/2003; H01L 29/66462
See application file for complete search history.

(56) References Cited

U.S. PATENT DOCUMENTS

| | | | |
|---|---|---|---|
| 6,258,685 B1 * | 7/2001 | Fujita et al. | ......... 438/312 |
| 7,112,830 B2 | 9/2006 | Munns | |
| 7,547,925 B2 | 6/2009 | Wong et al. | |
| 2006/0113520 A1 * | 6/2006 | Yamamoto et al. | ......... 257/3 |

(Continued)

OTHER PUBLICATIONS

Srivastava, P., et al., "Si Trench Around Drain (STAD) Technology of GaN-DHFETs on Si Substrate for Boosting Power Performance", IEEE, 2001.

*Primary Examiner* — Xia L Cross
(74) *Attorney, Agent, or Firm* — Hauptman Ham, LLP

(57) ABSTRACT

A semiconductor device includes a substrate, and a seed layer over the substrate, wherein the seed layer comprises carbon dopants. The semiconductor device further includes a channel layer over the seed layer, and an active layer over the channel layer, wherein the active layer has a band gap discontinuity with the channel layer. A method of making a transistor includes forming a seed layer over a substrate, and doping the seed layer, wherein doping the seed layer comprises introducing carbon dopants into the seed layer. The method further includes forming a channel layer over the seed layer, and forming an active layer over the channel layer, wherein the active layer has a band gap discontinuity with the channel layer.

20 Claims, 7 Drawing Sheets

(56) References Cited

U.S. PATENT DOCUMENTS

| | | | |
|---|---|---|---|
| 2006/0281238 A1* | 12/2006 | Harris | H01L 29/7783 438/172 |
| 2007/0108456 A1 | 5/2007 | Wong et al. | |
| 2008/0176366 A1* | 7/2008 | Mita | H01L 29/2003 438/172 |
| 2008/0191216 A1* | 8/2008 | Machida | H01L 25/18 257/76 |
| 2010/0025730 A1* | 2/2010 | Heikman et al. | 257/194 |
| 2010/0244101 A1* | 9/2010 | Kokawa et al. | 257/201 |
| 2010/0288999 A1* | 11/2010 | Kikuchi | H01L 33/06 257/13 |
| 2011/0042684 A1* | 2/2011 | Tanizaki | C30B 23/002 257/76 |
| 2012/0074385 A1* | 3/2012 | Tak et al. | 257/15 |
| 2013/0200495 A1* | 8/2013 | Keller | H01L 21/0237 257/615 |
| 2013/0240901 A1* | 9/2013 | Kohda et al. | 257/76 |
| 2013/0241006 A1* | 9/2013 | Hilt | H01L 29/78 257/402 |
| 2014/0264274 A1* | 9/2014 | Nakayama | H01L 29/66462 257/20 |
| 2016/0020102 A1* | 1/2016 | Byl | H01J 37/08 438/22 |

\* cited by examiner

SEMICONDUCTOR DEVICE, TRANSISTOR HAVING DOPED SEED LAYER AND METHOD OF MANUFACTURING THE SAME

RELATED APPLICATIONS

The instant application is related to the following U.S. patent applications:

U.S. patent application titled "TRANSISTOR HAVING HIGH BREAKDOWN VOLTAGE AND METHOD OF MAKING THE SAME," U.S. application Ser. No. 13/944,713;

U.S. patent application titled "TRANSISTOR HAVING DOPED SUBSTRATE AND METHOD OF MAKING THE SAME," U.S. application Ser. No. 13/944,494; and U.S. patent application titled "SEMICONDUCTOR DEVICE, HIGH ELECTRON MOBILITY TRANSISTOR (E-HEMT) AND METHOD OF MANUFACTURING," U.S. application Ser. No. 13/944,625.

The entire contents of the above-referenced applications are incorporated by reference herein.

BACKGROUND

In semiconductor technology, Group III-Group V (or III-V) semiconductor compounds are used to form various integrated circuit devices, such as high power field-effect transistors, high frequency transistors, high electron mobility transistors (HEMTs), or metal-insulator-semiconductor field-effect transistors (MISFETs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility and the ability to transmit signals at high frequencies, etc.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion. The drawings, which are incorporated herein, include the following in which.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
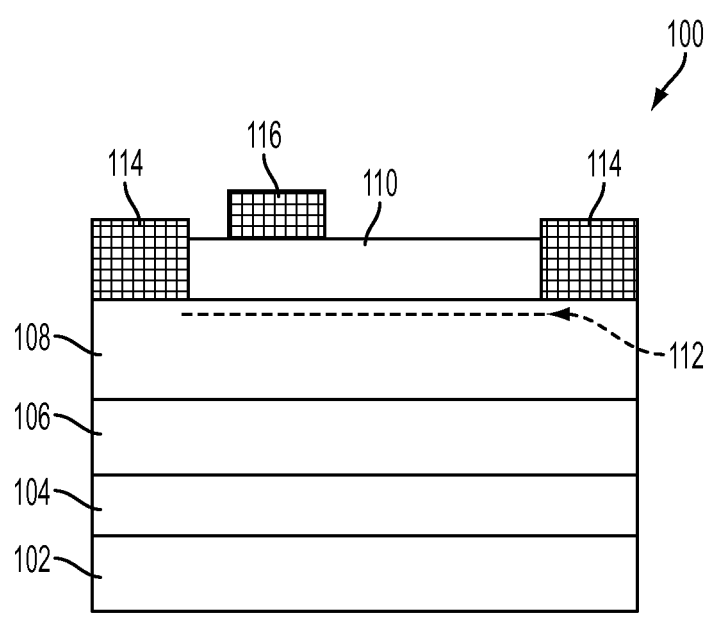
FIG. 1 is a cross-sectional view of a high electron mobility transistor (HEMT) in accordance with one or more embodiments.

FIG. 1 is a cross-sectional view of a high electron mobility transistor (HEMT) 100 in accordance with one or more embodiments. HEMT 100 includes a substrate 102. A seed layer 104 is over substrate 102. In some embodiments, seed layer 104 includes multiple layers. A graded layer 106 is over seed layer 104. A channel layer 108 is over graded layer 106. An active layer 110 is over channel layer 108. Due to a band gap discontinuity between channel layer 108 and active layer 110, a two dimension electron gas (2-DEG) 112 is formed in the channel layer near an interface with the active layer. Electrodes 114 are over channel layer 108 and a gate 116 is over active layer 110 between the electrodes.

Substrate 102 acts as a support for HEMT 100. In some embodiments, substrate 102 is a silicon substrate. In some embodiments, substrate 102 includes silicon carbide (SiC), sapphire, or another suitable substrate material. In some embodiments, substrate 102 is a silicon substrate having a (111) lattice structure. In some embodiments, substrate 102 is doped.

In some embodiments, substrate 102 is doped with p-type dopants. In some embodiments, the p-type dopants include boron, aluminum, gallium, indium, titanium, boron di-fluoride, combinations thereof, or other suitable p-type dopants. The dopant concentration ranges from about $1 \times 10^{18}$ ions/cm$^3$ to about $1 \times 10^{23}$ ions/cm$^3$. In some embodiments, the p-type dopants are implanted using an ion implantation process to implant dopants directly into substrate 102. In some embodiments, the p-type dopants are introduced using a plasma enhanced chemical vapor etching (PECVE) process, a reactive ion etching (RIE) process, a ion implantation (IMP) or another suitable material removal process to remove a top portion of substrate 102 and then a doped layer is grown over the remaining portion of the substrate. In some embodiments, an anneal process is performed following the introduction of the p-type dopants. In some embodiments, the anneal process is performed at a temperature ranging from about 900° C. to about 1100° C., for a duration of up to 60 minutes.

The introduction of the p-type dopants helps to reduce a concentration of electrons present at a top surface of the substrate. The lower electron concentration enables a higher voltage to be applied to gate 116 without damaging HEMT 100. As a result, HEMT 100 is able to be used in higher voltage applications in comparison with HEMTs which do not include substrate 102 having a doped top surface, as described above.

Seed layer 104 helps to compensate for a mismatch in lattice structures between substrate 102 and graded layer 106. In some embodiments, seed layer 104 includes multiple layers. In some embodiments, seed layer 104 includes a same material formed at different temperatures. In some embodiments, seed layer 104 includes a step-wise change in lattice structure. In some embodiments, seed layer 104 includes a continuous change in lattice structure. In some embodiments, seed layer 104 is formed by epitaxially growing the seed layer on substrate 102.

Seed layer 104 is doped with carbon. In some embodiments, a concentration of carbon dopants ranges from about $2 \times 10^{17}$ atoms/cm$^3$ to about $1 \times 10^{20}$ atoms/cm$^3$. In some embodiments, seed layer 104 is doped using an ion implantation process. In some embodiments, seed layer 104 is doped using an in-situ doping process. In some embodiments, seed layer 104 is formed using molecular oriented chemical vapor deposition (MOCVD), molecular beam epitaxy (MBE), hydride vapour phase epitaxy (HVPE), atomic layer deposition (ALD), physical vapor deposition (PVD) or another suitable formation process. In some embodiments, the in-situ doping process includes introducing the carbon dopants during formation of seed layer 104. In some embodiments, a source of the carbon dopants includes a hydrocarbon ($C_xH_y$) such as $CH_4$, $C_7H_7$, $C_{16}H_{10}$, or another suitable hydrocarbon. In some embodiments, the source of the carbon dopants includes $CBr_4$, $CCl_4$, or another suitable carbon source.

Doping seed layer 104 with carbon helps to trap silicon atoms to help prevent the silicon atoms from substrate 102 from diffusing into graded layer 106. By trapping the silicon atoms, an inversion current within HEMT 100 is reduced in comparison with HEMTs which do not include carbon in seed layer. The inversion current causes an HEMT to experience degradation in performance over time due to silicon diffusion into seed layer 104. The carbon dopants occupy locations in a lattice structure of seed layer 104 which would enable silicon atoms to diffuse into the seed layer, thus reducing a number of available diffusion routes for silicon into the seed layer.

In at least one example, seed layer 104 includes a first layer of aluminum nitride (AlN) and a second layer of AlN over the first layer of AlN. The second layer of AlN is formed at a high temperature, ranging from about 1000° C. to about 1300° C., and has a thickness ranging from about 50 nanometers (nm) to about 200 nm. If the thickness of the first layer of AlN is too small, subsequent layers formed on the first layer of AlN will experience a high stress at the interface with the first AlN layer due to lattice mismatch increasing a risk of layer separation. If the thickness of the first layer of AlN is too great, the material is wasted and production costs increase. The first layer of AlN is formed at a low temperature, ranging from about 900° C. to about 1000° C., and has a thickness ranging from about 20 nm to about 80 nm. The lower temperature provides a different lattice structure in the second AlN layer in comparison with the first AlN layer. The lattice structure in the second AlN layer is more different from a lattice structure of substrate 102 than the first AlN layer. If the thickness of the second layer of AlN is too small, subsequent layers formed on the second layer of AlN will experience a high stress at the interface with the second layer of AlN due to lattice mismatch increasing the risk of layer separation. If the thickness of the second layer of AlN is too great, the material is wasted and production costs increase.

Graded layer 106 provides additional lattice matching between seed layer 104 and channel layer 108. In some embodiments, graded layer 106 is doped with p-type dopants to reduce the risk of electron injection from substrate 102. Electron injection occurs when electrons from substrate 102 diffuse into channel layer 108. By including p-type dopants, the electrons are trapped by the positively charged dopants and do not negatively impact performance of 2-DEG 112 in channel layer 108. In some embodiments, the p-type dopant concentration in graded layer 106 is greater than or equal to $1\times10^{17}$ ions/cm$^3$. In some embodiments, the p-type dopants include carbon, iron, magnesium, zinc or other suitable p-type dopants. In some embodiments, graded layer 106 includes aluminum gallium nitride ($Al_xGa_{1-x}N$), where x is the aluminum content ratio in the graded layer. In some embodiments, the graded layer includes multiple layers each having a decreased ratio x (from a layer adjoining seed layer 104 to a layer that adjoins SLS 108, or from the bottom to the top portions of the graded layer). In some embodiments, graded layer has a thickness ranging from about 550 nm to about 1050 nm. If graded layer 106 is too thin, electrons from substrate 102 will be injected into channel layer 110 at high voltages, negatively impacting 2-DEG 112 or a lattice mismatch between seed layer 104 and channel layer 108 will result in a high stress in the channel layer and increase a risk of layer separation. If graded layer 106 is too thick, material is wasted and production costs increase. In some embodiments, the graded layer is formed at a temperature ranging from about 1000° C. to about 1200° C. In some embodiments, a p-type dopant concentration of graded layer 106 increases from a bottom of the graded layer to a top of the graded layer.

In at least one example, graded layer 106 includes three graded layers. A first graded layer adjoins seed layer 104. The first graded layer includes $Al_xGa_{1-x}N$, where x ranges from about 0.7 to about 0.9. A thickness of the first graded layer ranges from about 50 nm to about 200 nm. A second graded layer is on the first graded layer. The second graded layer includes $Al_xGa_{1-x}N$, where x ranges from about 0.4 to about 0.6. A thickness of the second graded layer ranges from about 150 nm to about 250 nm. A third graded layer is on the second graded layer. The third graded layer includes $Al_xGa_{1-x}N$, where x ranges from about 0.15 to about 0.3. A thickness of the third graded layer ranges from about 350 nm to about 600 nm.

Channel layer 108 is used to help form a conductive path for selectively connecting electrodes 114. In some embodiments, channel layer 108 has a dopant concentration of p-type dopants of less than or equal to $1\times10^{17}$ ions/cm$^3$. In some embodiments, channel layer 108 includes undoped GaN. In some embodiments, channel layer 108 has a thickness ranging from about 0.5 μm to about 5.0 μm. If a thickness of channel layer 108 is too thin, the channel layer will not provide sufficient charge carriers to allow HEMT 100 to function properly. If the thickness of channel layer 108 is too great, material is wasted and production costs increase. In some embodiments, channel layer 108 is formed by an epitaxial process. In some embodiments, channel layer 108 is formed at a temperature ranging from about 1000° C. to about 1200° C.

Active layer 110 is used to provide the band gap discontinuity with channel layer 108 to form 2-DEG 112. In some embodiments, active layer 110 includes AlN. In some embodiments, active layer 110 includes a mixed structure, e.g., $Al_xGa_{1-x}N$, where x ranges from about 0.1 to 0.3. In some embodiments where active layer 110 includes an AlN layer and a mixed structure layer, a thickness of the AlN layer ranges from about 0.5 nm to about 1.5 nm. If active layer 110 is too thick, selectively controlling the conductivity of the channel layer is difficult. If active layer 110 is too thin, an insufficient amount of electrons are available for 2-DEG 112. In some embodiments, active layer 110 is formed using an epitaxial process. In some embodiments, active layer 110 is formed at a temperature ranging from about 1000° C. to about 1200° C.

2-DEG 112 acts as the channel for providing conductivity between electrodes 114. Electrons from a piezoelectric effect in active layer 110 drop into channel layer 108, and thus create a thin layer of highly mobile conducting electrons in the channel layer.

Electrodes 114 act as a source and a drain for HEMT 100 for transferring a signal into or out of the HEMT. Gate 116 helps to modulate conductivity of 2-DEG 112 for transferring the signal between electrodes 114.

HEMT 100 is normally conductive meaning that a positive voltage applied to gate 116 will reduce the conductivity between electrodes 114 along 2-DEG 112.

Figure 2:
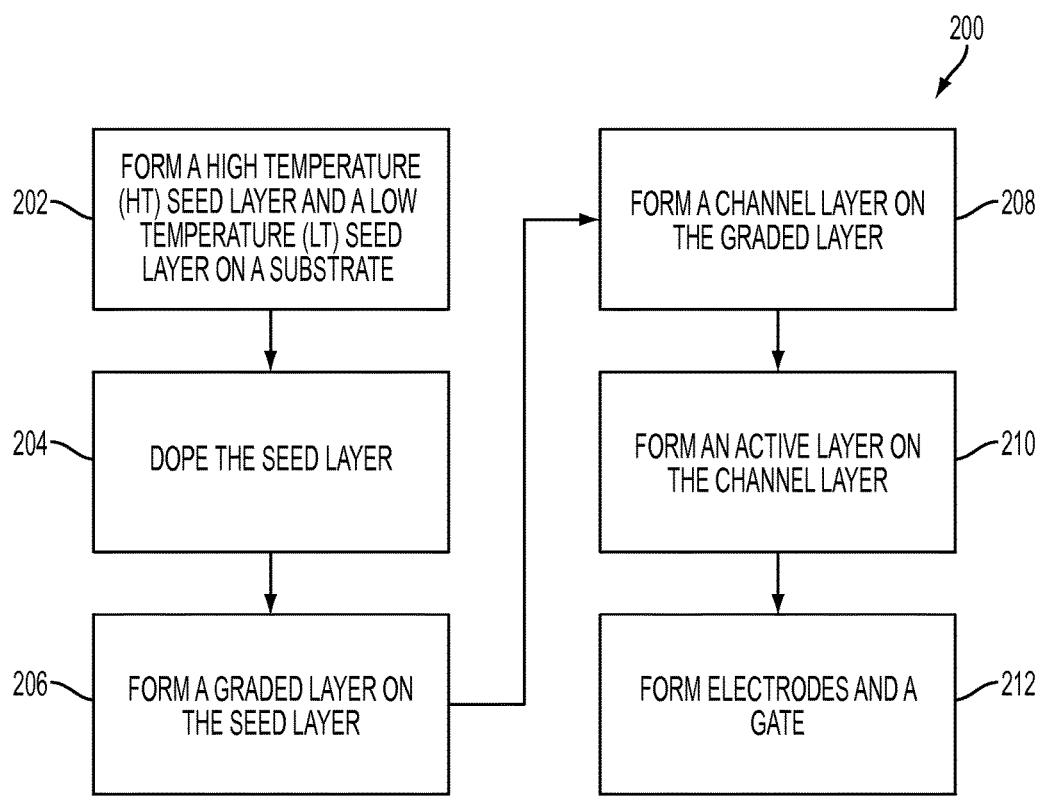
FIG. 2 is a flow chart of a method of making an HEMT in accordance with one or more embodiments.

FIG. 2 is a flow chart of a method 200 of making an HEMT in accordance with one or more embodiments. Method 200 begins with operation 202 in which a low temperature (LT) seed layer and a high temperature (HT) seed layer are formed on a substrate, e.g., substrate 102. The LT seed layer is formed on the substrate and the HT seed layer is formed on the LT seed layer.

In some embodiments, LT seed layer and HT seed layer include AlN. In some embodiments, the formation of LT seed layer and HT seed layer are performed by an epitaxial growth process. In some embodiments, the epitaxial growth process includes a metal-organic chemical vapor deposition (MOCVD) process, a molecular beam epitaxy (MBE) process, a hydride vapor phase epitaxy (HVPE) process or another suitable epitaxial process. In some embodiments, the MOCVD process is performed using aluminum-containing precursor and nitrogen-containing precursor. In some embodiments, the aluminum-containing precursor includes trimethylaluminium (TMA), triethylaluminium (TEA), or other suitable chemical. In some embodiments, the nitrogen-containing precursor includes ammonia, tertiarybutylamine (TBAm), phenyl hydrazine, or other suitable chemical. In some embodiments, the LT seed layer or the HT seed layer includes a material other than AlN. In some embodiments, the HT seed layer has a thickness ranging from about 50 nm to about 200 nm. In some embodiments, the HT seed layer is formed at a temperature ranging from about 1000° C. to about 1300° C. In some embodiments, the LT seed layer has a thickness ranging from about 20 nm to about 80 nm. In some embodiments, the LT seed layer is formed at a temperature ranging from about 900° C. to about 1000° C.

Figure 3A:
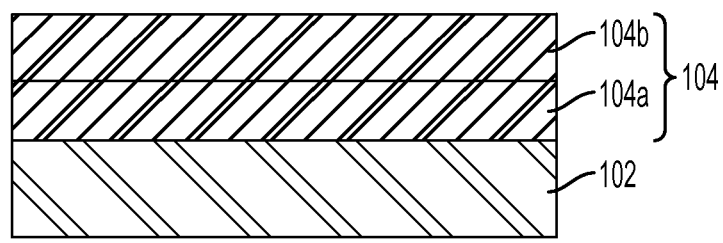
FIGS. 3A-3D are cross-sectional view of a HEMT at various stages of production in accordance with one or more embodiments.

FIG. 3A is a cross-sectional view of a HEMT following operation 202. The HEMT includes seed layer 104 on substrate 102. Seed layer 104 includes a HT seed layer 104a on substrate 102 and a LT seed layer 104b on the HT seed layer.

In operation 204, the seed layer is doped with carbon. In some embodiments, the seed layer is doped to a carbon dopant concentration ranging from about $2 \times 10^{17}$ atoms/cm$^3$ to about $1 \times 10^{20}$ atoms/cm$^3$. In some embodiments, the seed layer is doped using ion implantation process. In some embodiments, the ion implantation process is performed at an implantation energy ranging from about 30 kilo-electron volts (KeV) to about 150 (KeV). In some embodiments, the ion implantation process is performed using an implantation angle ranging from about 5-degrees to about 10-degrees. In some embodiments, the seed layer is doped using an in-situ doping process. In some embodiments, operations 202 and 204 are combined into a single operation. In some embodiments, at least one layer of the seed layer is formed using MOCVD, MBE, ALD, PVD or another suitable formation process. In some embodiments, the in-situ doping process includes introducing the carbon dopants during formation of at least one layer of the seed layer. In some embodiments, the carbon dopants are introduced using a carbon source including a hydrocarbon ($C_xH_y$) such as $CH_4$, $C_7H_7$, $C_{16}H_{10}$, or another suitable hydrocarbon. In some embodiments, the carbon is introduced using an ion implantation process and a hydrocarbon as a carbon source. In some embodiments, the carbon dopants are introduced using a carbon source including a carbon halide, such as $CBr_4$, $CCl_4$, or another suitable carbon source. In some embodiments, the carbon is introduced using an in-situ process and a carbon halide as a carbon source.

Figure 3B:
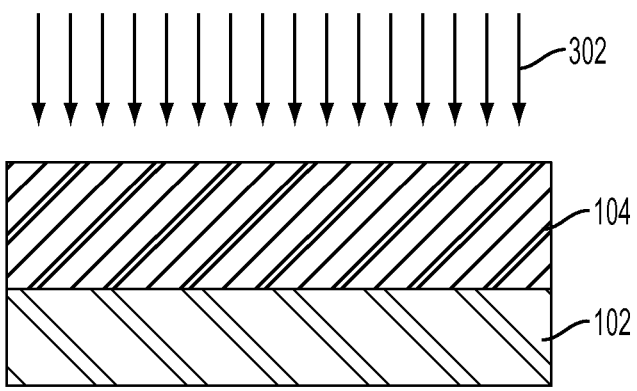

FIG. 3B is a cross-sectional view of a HEMT following operation 204. The HEMT includes seed layer 104 on substrate 102. Seed layer 104 is doped using a dopant process 302. Dopant process 302 introduces carbon into seed layer 104.

Returning to FIG. 2, method 200 continues with operation 206 in which a graded layer is formed on the LT seed layer. In some embodiments, the graded layer includes an aluminum-gallium nitride ($Al_xGa_{1-x}N$) layer. In some embodiments, the graded aluminum gallium nitride layer has two or more aluminum-gallium nitride layers each having a different ratio x decreased from the bottom to the top. In some embodiments, each of the two or more aluminum-gallium nitride layers is formed by performing an epitaxial process. In some embodiments, the epitaxial process includes a MOCVD process, a MBE process, a HVPE process or another suitable epitaxial process. In some embodiments, the MOCVD process uses an aluminum-containing precursor, a gallium-containing precursor, and a nitrogen-containing precursor. In some embodiments, the aluminum-containing precursor includes TMA, TEA, or other suitable chemical. In some embodiments, the gallium-containing precursor includes trimethylgallium (TMG), triethylgallium (TEG), or other suitable chemical. In some embodiments, the nitrogen-containing precursor includes ammonia, TBAm, phenyl hydrazine, or other suitable chemical. In some embodiments, the graded aluminum gallium nitride layer has a continuous gradient of the ratio x gradually decreased from the bottom to the top. In some embodiments, x ranges from about 0.5 to about 0.9. In some embodiments, the graded layer is formed at a temperature ranging from about 1000° C. to about 1200° C. In some embodiments, the graded layer is doped with p-type dopants, such as carbon, iron, magnesium, zinc or other suitable p-type dopants.

In at least one embodiment, a first graded layer is formed on the LT seed layer. The first graded layer adjoins seed layer 104. The first graded layer includes $Al_xGa_{1-x}N$, where x ranges from about 0.7 to about 0.9. A thickness of the first graded layer ranges from about 50 nm to about 200 nm. In some embodiments, the first graded layer is formed using epitaxy. In some embodiments, the first graded layer is formed at a temperature ranging from about 1000° C. to about 1200° C. A second graded layer is formed on the first graded layer. The second graded layer includes $Al_xGa_{1-x}N$, where x ranges from about 0.4 to about 0.6. A thickness of the second graded layer ranges from about 150 nm to about 250 nm. In some embodiments, the second graded layer is formed using epitaxy. In some embodiments, the second graded layer is formed at a temperature ranging from about 1000° C. to about 1200° C. A third graded layer is formed on the second graded layer. The third graded layer includes $Al_xGa_{1-x}N$, where x ranges from about 0.15 to about 0.3. A thickness of the third graded layer ranges from about 350 nm to about 600 nm. In some embodiments, the third graded layer is formed using epitaxy. In some embodiments, the third graded layer is formed at a temperature ranging from about 1000° C. to about 1200° C.

In operation 208, a channel layer is formed on the graded layer. In some embodiments, the channel layer includes p-type dopants. In some embodiments, the channel layer includes GaN, and the P-type doping is implemented by using dopants including carbon, iron, magnesium, zinc or other suitable p-type dopants. In some embodiments, the channel layer is formed by performing an epitaxial process.

In some embodiments, the epitaxial process includes a MOCVD process, a MBE process, a HVPE process or another suitable epitaxial process. In some embodiments, the channel layer has a thickness ranging from about 0.2 μm to about 1.0 μm. In some embodiments, the dopant concentration in the channel layer is equal to or less than about $1\times10^{17}$ ions/cm$^3$. In some embodiments, the channel layer is undoped. In some embodiments, the channel layer is formed at a temperature ranging from about 1000° C. to about 1200° C.

Figure 3C:
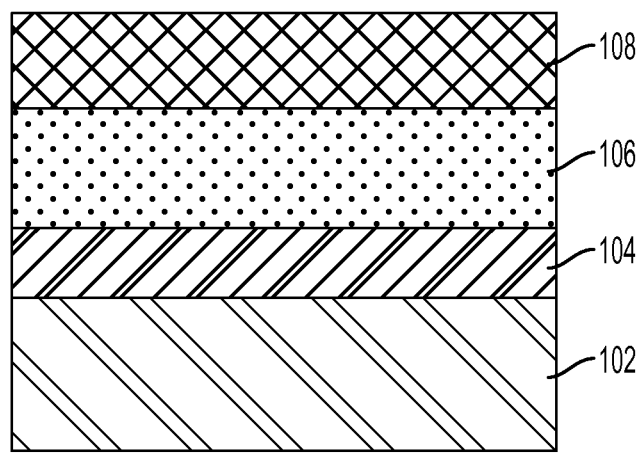

FIG. 3C is a cross-sectional view of a HEMT following operation 208. The HEMT includes graded layer 106 on seed layer 104. For the sake of simplicity, seed layer 104 and graded layer 106 are shown as single layers in the remaining cross-sectional views. Channel layer 108 is also on graded layer 106.

Returning to FIG. 2, in operation 210 an active layer is formed on the channel layer. In some embodiments, the active layer includes AlN, $Al_xGa_{1-x}N$, combinations thereof or other suitable materials. In some embodiments, x ranges from about 0.1 to about 0.3. In some embodiments, the active layer is formed by performing an epitaxial process. In some embodiments, the epitaxial process includes a MOCVD process, a MBE process, a HVPE process or another suitable epitaxial process. In some embodiments, the active layer has a thickness ranging from about 10 nm to about 40 nm. In some embodiments where the active layer includes both AlN and $Al_xGa_{1-x}N$, the AlN layer has a thickness ranging from about 0.5 nm to about 1.5 nm and the $Al_xGa_{1-x}N$ layer has a thickness ranging from about 10 nm to about 40 nm. In some embodiments, the active layer is formed at a temperature ranging from about 1000° C. to about 1200° C.

Figure 3D:
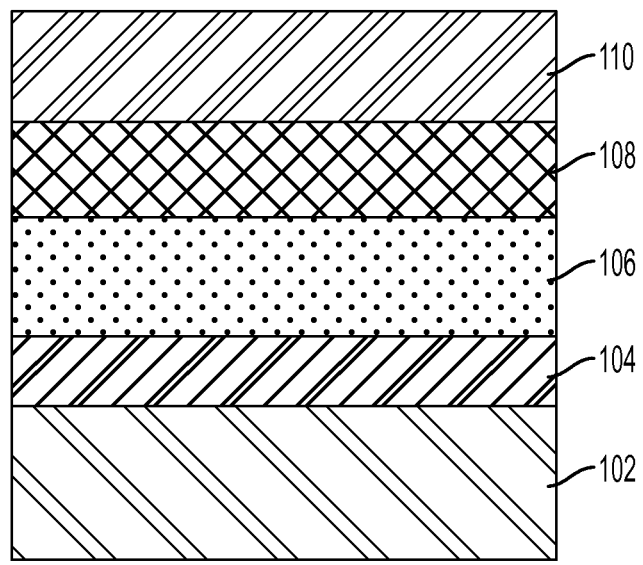

FIG. 3D is a cross-sectional view of the HEMT following operation 210 in accordance with one or more embodiments. The HEMT includes active layer 110 on channel layer 108. 2-DEG 112 is formed in channel layer 108 due to the band gap discontinuity between active layer 110 and the channel layer.

Returning to FIG. 2, in operation 212 electrodes and a gate are formed on the active layer. The electrodes are formed over the other portion of the channel layer, and the gate is formed over the active layer. In some embodiments, a patterned mask layer (i.e., a photoresistive layer) is formed on the upper surface of the active layer, and an etching process is performed to remove a portion of the active layer to form openings partially exposing an upper surface of the other portion of the channel layer. A metal layer is then deposited over the patterned active layer and fills the openings and contacts the other portion of the channel layer. Another patterned photoresist layer is formed over the metal layer, and the metal layer is etched to form the electrodes over the openings and the gate over the upper surface of the active layer. In some embodiments, the metal layer for forming the electrodes or the gate includes one or more conductive materials. In some embodiments, the electrodes or the gate include one or more layers of conductive materials. In at least one embodiment, the electrodes or the gate include at least one barrier layer contacting the other portion of the channel layer and/or the active layer.

Following operation 212, the HEMT has a structure similar to HEMT 100.

Figure 4:
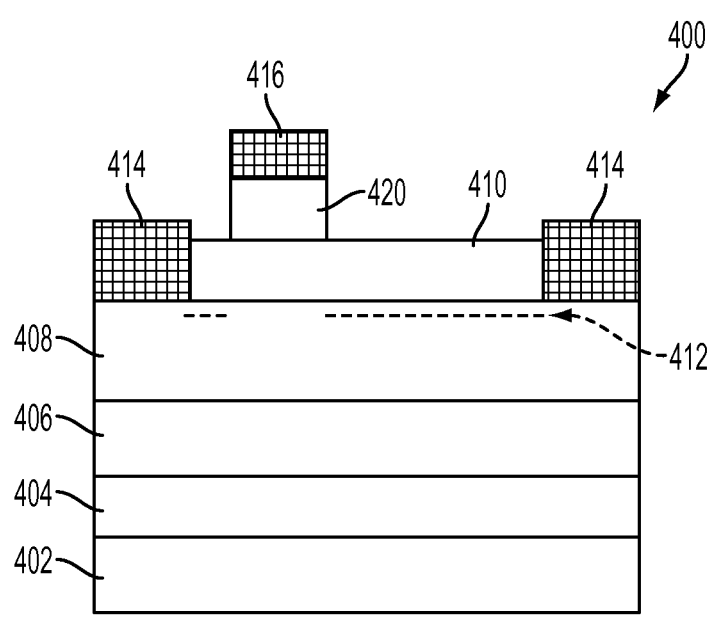
FIG. 4 is a cross-sectional view of an enhanced HEMT (E-HEMT) in accordance with one or more embodiments.

FIG. 4 is a cross-sectional view of an enhanced HEMT (E-HEMT) 400 in accordance with one or more embodiments. E-HEMT 400 is similar to HEMT 100. Similar elements have a same reference number as HEMT 100 increased by 300. In comparison with HEMT 100, E-HEMT 400 includes a semiconductor material 420 between gate 416 and active layer 410. In some embodiments, semiconductor material 420 is a group III-V semiconductor material such as GaN, AlGaN, InGaN, or another suitable group III-V semiconductor material. In some embodiments, semiconductor material 420 is doped with p-type or n-type dopants. In some embodiments, the p-type dopants include carbon, iron, magnesium, zinc or other suitable p-type dopants. In some embodiments, the n-type dopants include silicon, oxygen or other suitable n-type dopants. In comparison with HEMT 100, E-HEMT 400 is normally non-conductive between electrodes 414. As a positive voltage is applied to gate 416, E-HEMT 400 provides an increased conductivity between electrodes 414.

Figure 5:
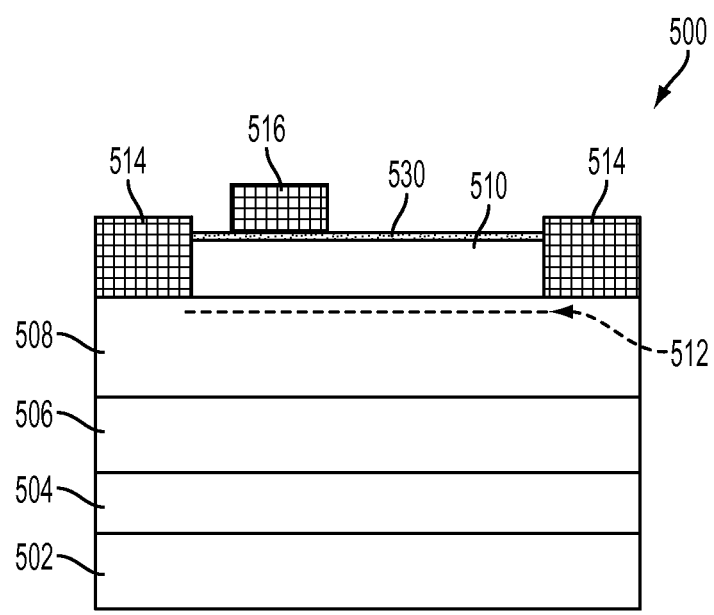
FIG. 5 is a cross-sectional view of a depletion metal-insulator-semiconductor field-effect transistor (D-MISFET) in accordance with one or more embodiments.

FIG. 5 is a cross-sectional view of a depletion metal-insulator-semiconductor field-effect transistor (D-MISFET) 500 in accordance with one or more embodiments. D-MISFET 500 is similar to HEMT 100. Similar elements have a same reference number as HEMT 100 increased by 400. In comparison with HEMT 100, D-MISFET 500 includes a dielectric layer 530 between gate 516 and active layer 510. In some embodiments, dielectric layer 530 includes silicon dioxide. In some embodiments, dielectric layer 530 includes a high-k dielectric layer having a dielectric constant greater than a dielectric constant of silicon dioxide. Similar to HEMT 100, D-MISFET 500 is normally conductive between electrodes 514. As a positive voltage is applied to gate 516, D-MISFET 500 provides a decreased conductivity between electrodes 514.

Figure 6:
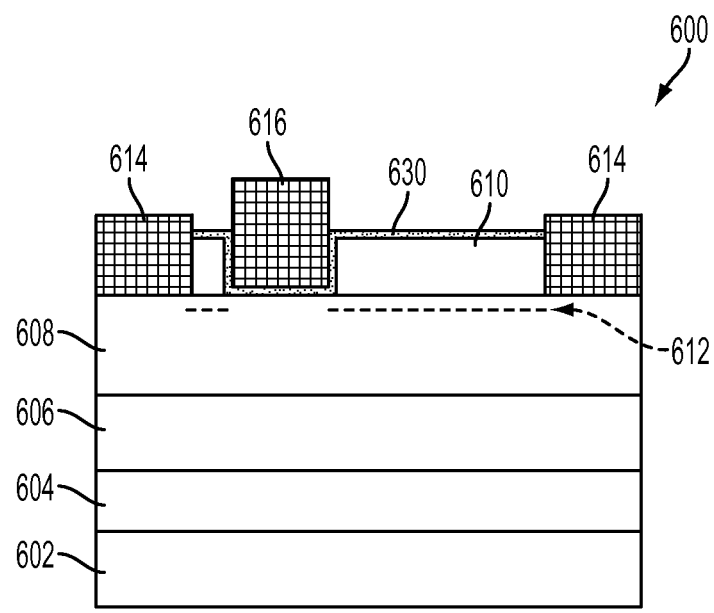
FIG. 6 is a cross-sectional view of an enhanced metal-insulator-semiconductor field-effect transistor (E-MISFET) in accordance with one or more embodiments.

FIG. 6 is a cross-sectional view of an enhanced metal-insulator-semiconductor field-effect transistor (E-MISFET) 600 in accordance with one or more embodiments. E-MISFET 600 is similar to HEMT 100. Similar elements have a same reference number as HEMT 100 increased by 500. In comparison with HEMT 100, E-MISFET 600 gate 616 is in contact with channel layer 608 without intervening active layer 610. E-MISFET 600 further includes a dielectric layer 630 between gate 616 and channel layer 608. Dielectric layer 630 also separates sidewalls of gate 616 and active layer 610. In some embodiments, dielectric layer 630 includes silicon dioxide. In some embodiments, dielectric layer 630 includes a high-k dielectric layer having a dielectric constant greater than a dielectric constant of silicon dioxide. In comparison with HEMT 100, E-MISFET 600 is normally non-conductive between electrodes 614. As a positive voltage is applied to gate 616, E-MISFET 600 provides an increased conductivity between electrodes 614.

One aspect of this description relates to a semiconductor device including a substrate, and a seed layer over the substrate, wherein the seed layer comprises carbon dopants. The semiconductor device further includes a channel layer over the seed layer, and an active layer over the channel layer, wherein the active layer has a band gap discontinuity with the channel layer.

Another aspect of this description relates to a transistor. The transistor includes a substrate, and a seed layer over the substrate, wherein the seed layer has a carbon dopant concentration ranging from about $2\times10^{17}$ atoms/cm$^3$ to about $1\times10^{20}$ atoms/cm$^3$. The transistor further includes a channel layer over the seed layer, and an active layer over the channel layer, wherein the active layer has a band gap discontinuity with the channel layer.

Still another aspect of this description relates to a method of making a transistor. The method includes forming a seed layer over a substrate, and doping the seed layer, wherein doping the seed layer comprises introducing carbon dopants into the seed layer. The method further includes forming a channel layer over the seed layer, and forming an active layer over the channel layer, wherein the active layer has a band gap discontinuity with the channel layer.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising:
    a single layer substrate having a substrate lattice structure, wherein the substrate comprises p-type dopants;
    an AlN seed layer above and in direct contact with the substrate, the AlN seed layer comprising an AlN first seed sublayer having a first lattice structure and an AlN second seed sublayer having a second lattice structure, the second lattice structure being different than the first lattice structure, wherein a portion of the AlN seed layer closest to the substrate comprises carbon dopants and has a different lattice structure from the substrate lattice structure, and wherein the second seed sublayer is formed at a temperature ranging from about 1000° C. to about 1300° C.;
    a channel layer over the AlN seed layer;
    an active layer over the channel layer, wherein the active layer has a band gap discontinuity with the channel layer; and
    a graded layer in direct contact with the AlN seed layer with the channel layer comprising a single material layer in direct contact with the graded layer, wherein the graded layer comprises:
        a first graded sublayer including $Al_xGa_{1-x}N$, where x ranges from 0.7 to 0.9;
        a second graded sublayer on the first graded sublayer, the second graded sublayer including $Al_xGa_{1-y}N$, where y ranges from 0.4 to 0.6; and
        a third graded sublayer on the second graded sublayer, the third graded sublayer including $Al_zGa_{1-z}N$, where z ranges from 0.15 to 0.3.

2. The semiconductor device of claim 1, wherein a concentration of the carbon dopants ranges from about $2\times10^{17}$ atoms/cm$^3$ to about $1\times10^{20}$ atoms/cm$^3$.

3. The semiconductor device of claim 1, wherein a thickness of the first graded sublayer ranges from about 50 nanometers (nm) to about 200 nm.

4. The semiconductor device of claim 1, wherein a thickness of the second graded sublayer ranges from about 150 nm to about 250 nm.

5. The semiconductor device of claim 1, wherein a thickness of the third graded sublayer ranges from about 350 nm to about 600 nm.

6. The semiconductor device of claim 1, wherein the channel layer is undoped.

7. The semiconductor device of claim 1, further comprising:
    a first electrode in direct contact with the channel layer;
    a second electrode in direct contact with the channel layer; and
    a gate between the first electrode and the second electrode, wherein the gate is configured to control a conductivity of a two-dimensional electron gas (2-DEG) between the first electrode and the second electrode.

8. The semiconductor device of claim 7, wherein the gate is in direct contact with the active layer, and further wherein the semiconductor device is configured to be normally conductive.

9. The semiconductor device of claim 7, further comprising
    a semiconductor material in direct contact with the active layer between the first electrode and the second electrode,
        wherein the gate is in direct contact with the semiconductor material and
        further wherein the semiconductor device is configured to be normally non-conductive.

10. The semiconductor device of claim 7, further comprising
    a dielectric layer in direct contact with the active layer between the first electrode and the second electrode,
        wherein the gate is in direct contact with the dielectric layer, and
        further wherein the semiconductor device is configured to be normally conductive.

11. The semiconductor device of claim 7, further comprising
    a dielectric layer having a first portion in direct contact with an upper surface of the active layer, a second portion in direct contact with an upper surface region of the channel layer, and a third portion in direct contact with a sidewall of the active layer adjacent the upper surface region of the channel layer,
        wherein the gate directly contacts the second and third portions of the dielectric layer, and
        further wherein the semiconductor device is configured to be normally non-conductive, and the semiconductor device is free of an inversion current during operation.

12. The semiconductor device of claim 1, wherein:
    the first lattice structure has a lattice structure between the substrate lattice structure and the second lattice structure.

13. The semiconductor device of claim 1, wherein the first seed sublayer has a thickness ranging from about 20 nm to about 80 nm, and the second seed sublayer has a thickness ranging from about 50 nm to about 200 nm.

14. A transistor comprising:
    a single layer silicon substrate, wherein the silicon substrate comprises p-type dopants;
    a seed layer above and in direct contact with the silicon substrate, wherein the seed layer consists of carbon-doped AlN having a substantially constant carbon dopant concentration ranging from about $2\times10^{17}$ atoms/cm$^3$ to about $1\times10^{20}$ atoms/cm$^3$, wherein the seed layer comprises a first seed sublayer having a first lattice structure and a first carbon dopant concentration and a second seed sublayer having a second lattice structure having a second carbon dopant concentration, the second lattice structure being different than the first lattice structure, the first carbon dopant concentration and the second carbon dopant concentration are substantially equal, the first seed sublayer having a thickness ranging from about 20 nm to about 80 nm, and the second seed sublayer having a thickness ranging from about 50 nm to about 200 nm;
    a graded layer above and in direct contact with the seed layer, wherein the graded layer is doped with p-type dopants and comprises;
        a first graded sublayer including $Al_xGa_{1-x}N$, where x ranges from 0.7 to 0.9, a second graded sublayer on the first graded sublayer, the second graded sublayer including $Al_yGa_{1-y}N$, where y ranges from 0.4 to 0.6, and a third graded sublayer on the second graded sublayer, the third graded sublayer including $Al_zGa_{1-z}N$, where z ranges from 0.15 to 0.3;

a channel layer directly over the graded layer; and an active layer in direct contact with the channel layer, wherein the active layer has a band gap discontinuity with the channel layer.

15. A method of making a transistor, the method comprising:

providing a silicon substrate comprising p-type dopants;

forming an AlN seed layer above and in direct contact with the silicon substrate, wherein a first sublayer is formed on the silicon substrate at a first temperature and a second sublayer formed on the first sublayer at a second temperature, the second temperature being higher than the first temperature, wherein the second temperature ranges from about 1000° C. to about 1300° C.;

doping the AlN seed layer, wherein doping the AlN seed layer comprises introducing carbon dopants into a portion of the AlN seed layer closest to the silicon substrate;

forming a channel layer over the AlN seed layer;

forming an active layer in direct contact with the channel layer, wherein the active layer has a band gap discontinuity with the channel layer; and forming a graded layer in direct contact with the AlN seed layer with the channel layer comprising a single material layer in direct contact with the graded layer, wherein the graded layer comprises:

a first graded sublayer including $Al_xGa_{1-x}N$, where x ranges from 0.7 to 0.9;

a second graded sublayer on the first graded sublayer, the second graded sublayer including $Al_yGa_{1-y}N$, where y ranges from 0.4 to 0.6; and a third graded sublayer on the second graded sublayer, the third graded sublayer including $Al_zGa_{1-z}N$, where z ranges from 0.15 to 0.3.

16. The method of claim 15, wherein doping the AlN seed layer comprises doping the AlN seed layer using ion implantation.

17. The method of claim 16, wherein the ion implantation process comprises introducing a hydrocarbon.

18. The method of claim 15, wherein doping the AlN seed layer comprises doping the AlN seed layer using an in-situ process during formation of the AlN seed layer.

19. The method of claim 18, wherein the in-situ process comprises forming the AlN seed layer using at least one of molecular oriented chemical vapor deposition (MOCVD), molecular beam epitaxy (MBE), atomic layer deposition (ALD) or physical vapor deposition (PVD), and introducing carbon dopants from a carbon source comprising at least one of $CBr_4$ or $CCl_4$.

20. The method of claim 15, wherein forming the AlN seed layer comprises:

forming the first sublayer having a thickness ranging from about 20 nm to about 80 nm; and forming the second sublayer having a thickness ranging from about 50 nm to about 200 nm.

* * * * *